Figure 1:
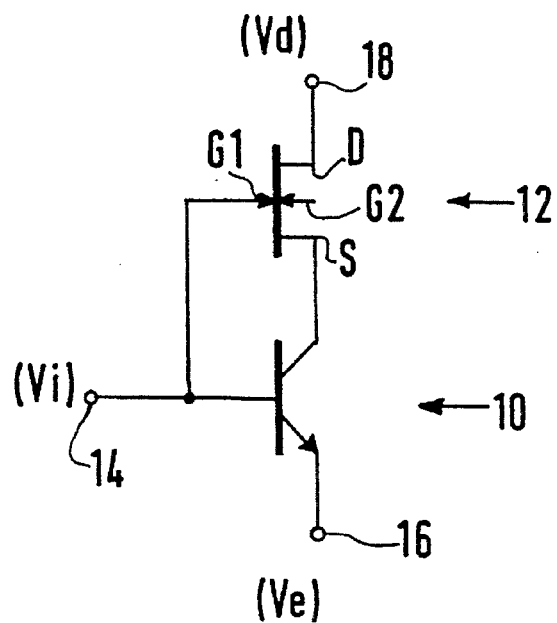

United States Patent [19]
Journeau

[11] Patent Number: 5,488,241
[45] Date of Patent: Jan. 30, 1996

[54] INTEGRATED DEVICE COMBINING A BIPOLAR TRANSISTOR AND A FIELD EFFECT TRANSISTOR

[75] Inventor: Jacques Journeau, Colomby, France

[73] Assignee: U.S. Philips Corporation, New York, N.Y.

[21] Appl. No.: 278,481

[22] Filed: Jul. 20, 1994

[30] Foreign Application Priority Data

Jul. 22, 1993 [FR] France .................... 93 09053

[51] Int. Cl.⁶ .................... H01L 29/80; H01L 29/808
[52] U.S. Cl. .................... 257/273; 257/256; 257/265
[58] Field of Search .................... 257/273, 272, 257/256, 262, 263, 264, 265

[56] References Cited

U.S. PATENT DOCUMENTS

| | | | |
|---|---|---|---|
| 3,578,514 | 5/1971 | Lesk | 148/175 |
| 4,485,392 | 11/1984 | Singer | 257/272 |
| 4,729,008 | 3/1988 | Beasom | 357/43 |
| 4,739,386 | 4/1988 | Tanizawa | 257/273 |
| 4,808,547 | 2/1989 | Beasom | 437/54 |
| 4,835,596 | 5/1989 | Werner | 257/273 |
| 4,987,469 | 1/1991 | Ludikhuize | 357/35 |

FOREIGN PATENT DOCUMENTS

| | | | |
|---|---|---|---|
| 0092671 | 2/1983 | European Pat. Off. | H01L 29/72 |
| 0249088 | 12/1987 | European Pat. Off. | H01L 27/06 |

OTHER PUBLICATIONS

"Improving Performance of Transistors" by D. C. Wyland, IBM Technical Disclosure Bulletin, vol. 13, No. 1, Jun. 1970, p. 204.

"500 V BIMOS Technology and its Applications", 16th Annual IEEE Power Electronics Conference, Toulouse, Jun. 1985 by E. Wildi et al.

Primary Examiner—Wael M. Fahmy
Attorney, Agent, or Firm—Steven R. Biren

[57] ABSTRACT

An integrated device combines a bipolar transistor (10) and a junction field effect transistor (12) so as to produce an output voltage (Vd) which is higher than the breakdown voltage ($BV_{CEO}$) of the bipolar transistor (10). A lateral extension (30) of the base zone (28), which forms a gate, is provided with an opening (38) in which a drain region (40) of the field effect transistor is situated. A heavily doped peripheral region (36) of the same type as the drain region (40) surrounds the lateral extension (30) on three sides, while a heavily doped buried layer region (34), which forms a conductive part of the collector of the bipolar transistor (10), extends to below the peripheral region (36) and forms with the latter the source of the field effect transistor (12). The resulting device has substantially improved breakdown voltage characteristics.

6 Claims, 3 Drawing Sheets

INTEGRATED DEVICE COMBINING A BIPOLAR TRANSISTOR AND A FIELD EFFECT TRANSISTOR

BACKGROUND OF THE INVENTION

The invention relates to an integrated device formed by the combination of a bipolar transistor and a junction field effect transistor, comprising:

a heavily doped emitter zone of a first conductivity type, a base zone which is less heavily doped than the former, which is of a second conductivity type opposed to the first type, in which the emitter zone is included, and which comprises a lateral extension forming a gate for the field effect transistor, a collector zone formed on the one hand by a portion of a weakly doped epitaxial layer of the first conductivity type supported by a weakly doped substrate of the second conductivity type, and on the other hand by a heavily doped buried layer region of the first conductivity type extending below the emitter zone, which device in addition comprises a strongly doped peripheral region of the first conductivity type which surrounds the base zone and its lateral extension at least partly and at a certain distance.

A device of this type is known from the U.S. Pat. No. 4,835,596. This document states that a breakdown voltage of the output electrode of the device of the order of 40 to 60 V may be obtained with the structure described.

However, it is well known that the performance levels required for integrated devices at ever increasing frequencies lead to the use of ever thinner epitaxial layers, at present of the order of no more than 1 to 1.5 μm. Accordingly, the thicknesses of the active zones present in the epitaxial layer are also very small, which results in a reduction in the breakdown voltage $BV_{CEO}$ of conventional NPN transistors, for example, to 7 V for a process used at present.

In these circumstances, the known device has a reduced performance level as regards its breakdown voltage, whereas it would be highly desirable if higher breakdown voltages could be achieved.

SUMMARY OF THE INVENTION

The present invention has for its particular aim to provide a device formed by the combination of a bipolar transistor and a field effect transistor which has a breakdown voltage of the output electrode which is substantially higher than that of the known device, all other conditions as to thicknesses and doping levels of the various layers remaining the same.

According to the invention, a device of the kind mentioned in the introductory paragraph is for this purpose characterized in that the lateral extension of the base zone comprises an opening in which a drain region for the field effect transistor is situated, which drain region is heavily doped of the first conductivity type, is completely surrounded by said lateral extension and is separated therefrom by a given lateral distance, and in that the buried layer region, which is of elongate shape, extends in longitudinal direction to beyond the assembly of the base zone and its lateral extension so as to be covered by said peripheral region, this latter region forming together with the buried layer region the source of the field effect transistor.

Compared with the device known from the cited document, the drain region of the field effect transistor in the invention is surrounded on all sides by the lateral extension of the base zone, whereas in the known device the drain region was of annular shape surrounding the lateral extension of the base zone.

The arrangement according to the invention is considerably more favourable for the breakdown voltage. In addition, according to the invention, the positions of the active zones of the bipolar transistor are laterally shifted relative to the position of the drain region. The heavily doped buried layer region, which forms the conducting part of the collector of the bipolar transistor, acts as a portion of the source of the field effect transistor, which portion is electrically connected at its ends to the remainder of this source formed by the heavily doped peripheral region.

The device according to the invention remains of a compact shape which is readily incorporated in an integrated circuit.

The breakdown voltage of the device may be even more strongly increased in an embodiment which is characterized in that the lateral extension of the base zone is bounded by an adjacent region of the same conductivity type and more weakly doped along the edge of the opening comprising the drain region.

The electric field developed in the region adjoining the lateral extension of the base zone at the edge of the opening is reduced, and the breakdown voltage is increased correspondingly thereby.

In a preferred embodiment of the device according to the invention, the thickness of the epitaxial layer and the doping concentration of this layer are chosen such that said epitaxial layer, in a region adjoining said adjacent more weakly doped region, is completely depleted of charge carriers at a given voltage applied to the junction formed between the drain region and the gate of the field effect transistor, which given voltage is lower than the breakdown voltage of said junction.

This arrangement is known per se under the genetic name "RESURF", which may be defined for practical purposes in that the product of the thickness of the epitaxial layer and its doping level has a value which lies substantially between 0.8 and $1.5 \times 10^{12}$ atoms/cm$^2$.

In the region which is liable to breakdown, the electric field is thus reduced under these conditions, and the breakdown voltage of the device is once more increased.

According to an embodiment which ensures a very favourable distribution of the electric field in the neighbourhood of the semiconductor surface, the device according to the invention is in addition characterized in that it comprises in that order on the surface of the device:

a first insulating layer, a first field electrode formed by a conductive layer in contact with the lateral extension of the base zone through a first opening in the first insulating layer and extending over the first insulating layer over said adjacent more weakly doped region in the direction of the drain region, and over a distance smaller than half the said lateral distance, a first part of a second field electrode, conductive and in contact with the drain region through a second opening in the first insulating layer, and extending in lateral direction on the first insulating layer in the direction of the first field electrode over a distance smaller than half the said lateral distance, a second insulating layer, and a second part of the second field electrode, conductive and in contact with the first part of this same electrode through an opening in the second insulating layer, and extending laterally on the second insulating layer in the direction of the first field electrode at least up to close to this first electrode.

An increase in the breakdown voltage of approximately 5 V has been observed in practice when this latter arrangement was used, compared with an identical device, but without field electrodes.

When a device is sought which is capable of providing a comparatively high output current, an advantageous structure of the device according to the invention is in addition characterized in that the field effect transistor is formed by two parts arranged symmetrically relative to a longitudinal axis of the buried layer region, of which parts the homologous regions are electrically connected in parallel, and in that the peripheral region completely surrounds the base zone and its lateral extension.

The bipolar transistor thus occupies a substantially central position, and the two parts of the field effect transistor are arranged on either side of the bipolar transistor.

The symmetrical shape of this device offers the advantage that it is very compact.

Another embodiment of the invention, which aims to increase the output current of the device even more, is characterized in that the field effect transistor is formed by a plurality of cells laterally aligned relative to the bipolar transistor, the peripheral region of one cell having a part in common with that of the cell adjacent thereto, while the homologous regions are interconnected with one another.

The following detailed description with reference to the annexed drawings, which are given by way of non-limitative examples, will render it clear what the nature of the invention is and how it may be carried into practice.

Figure 2:
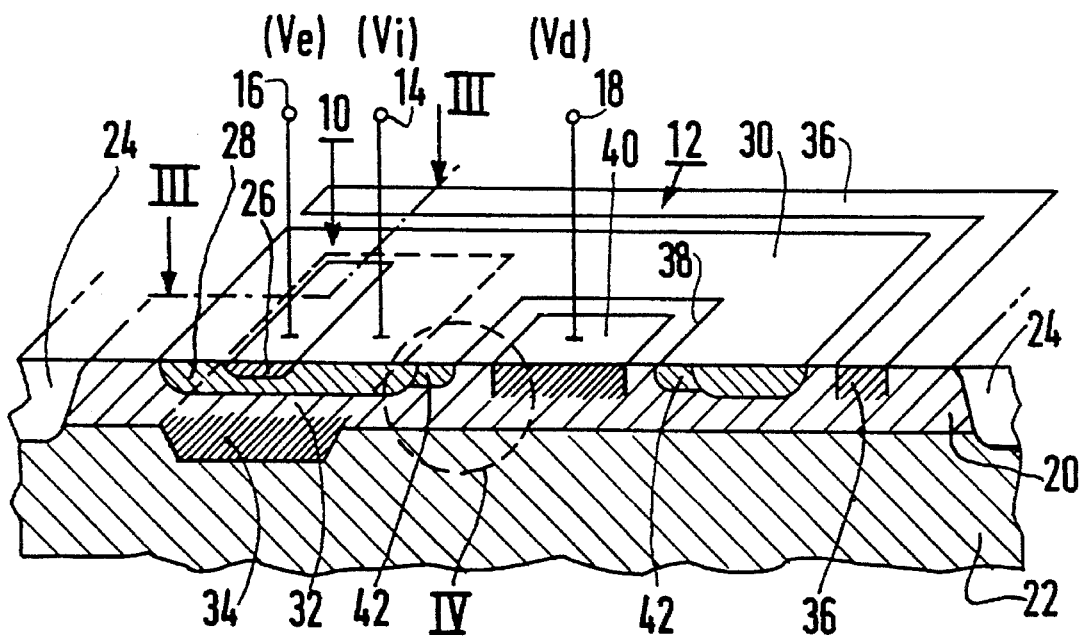
Figure 3:
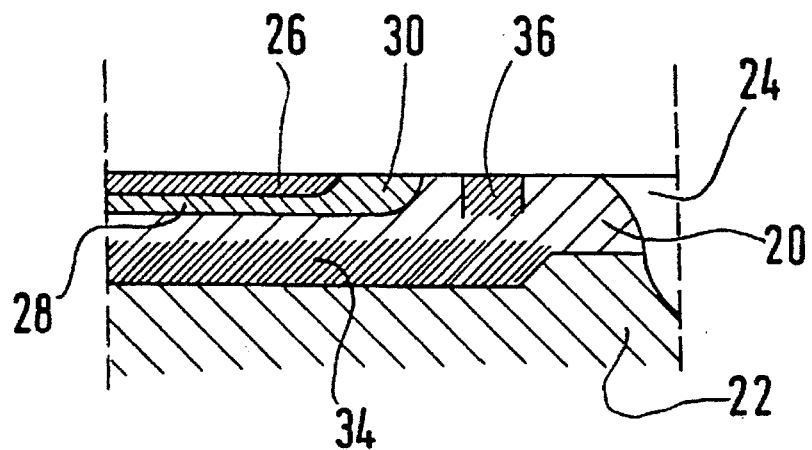
Figure 4:
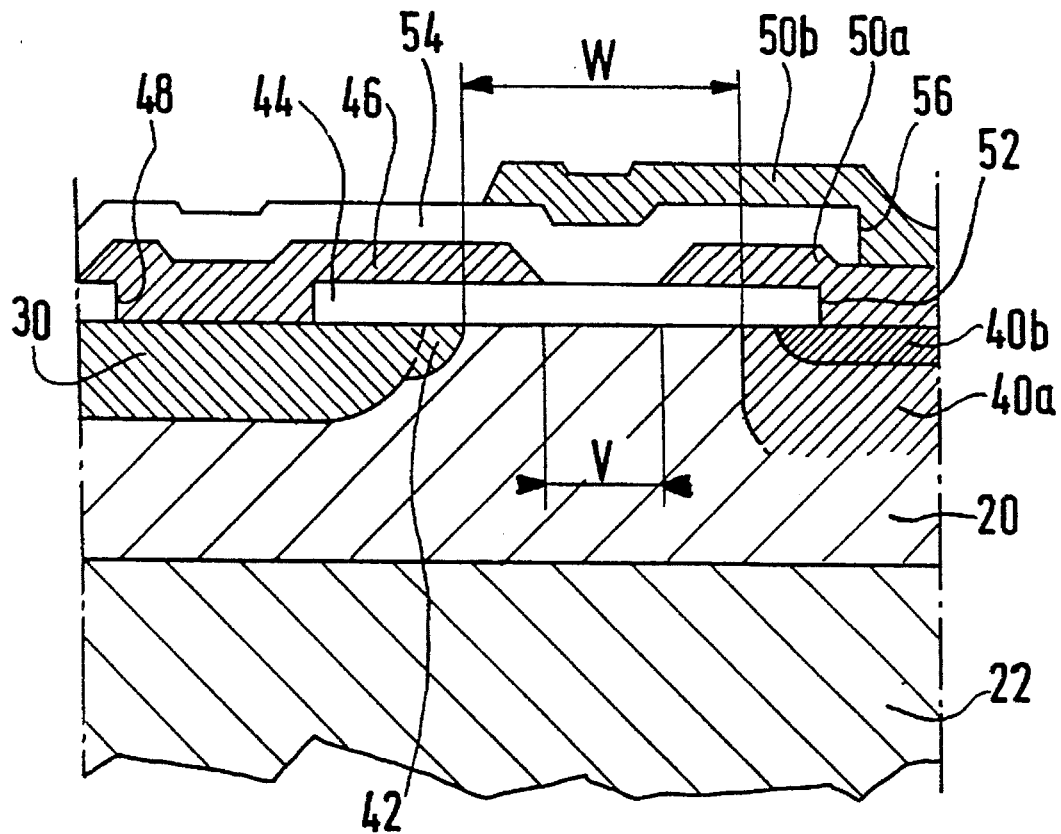
Figure 5:
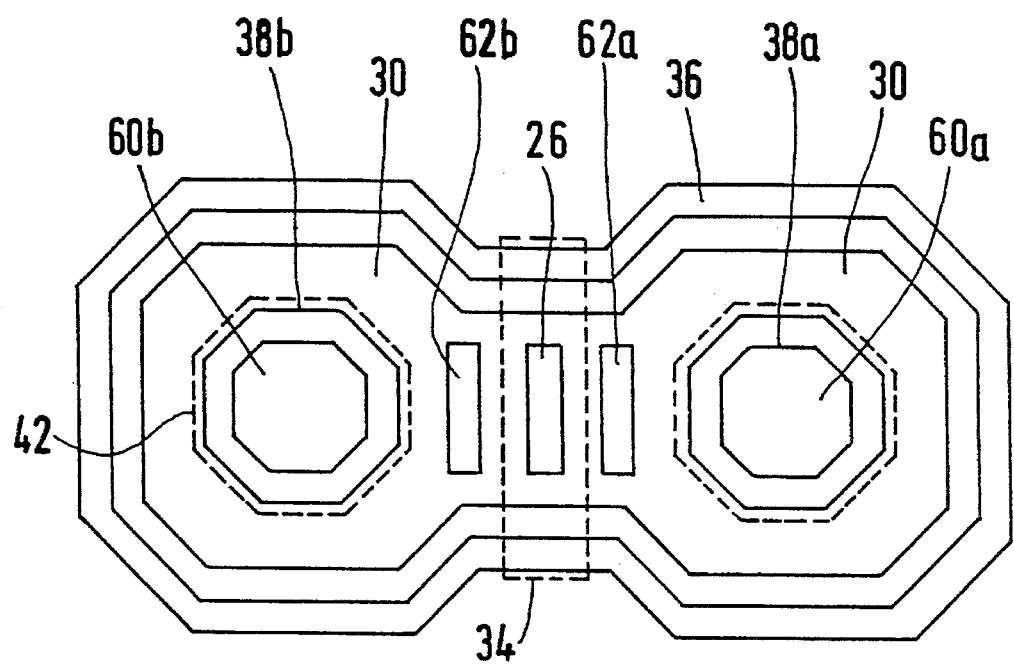
Figure 6:
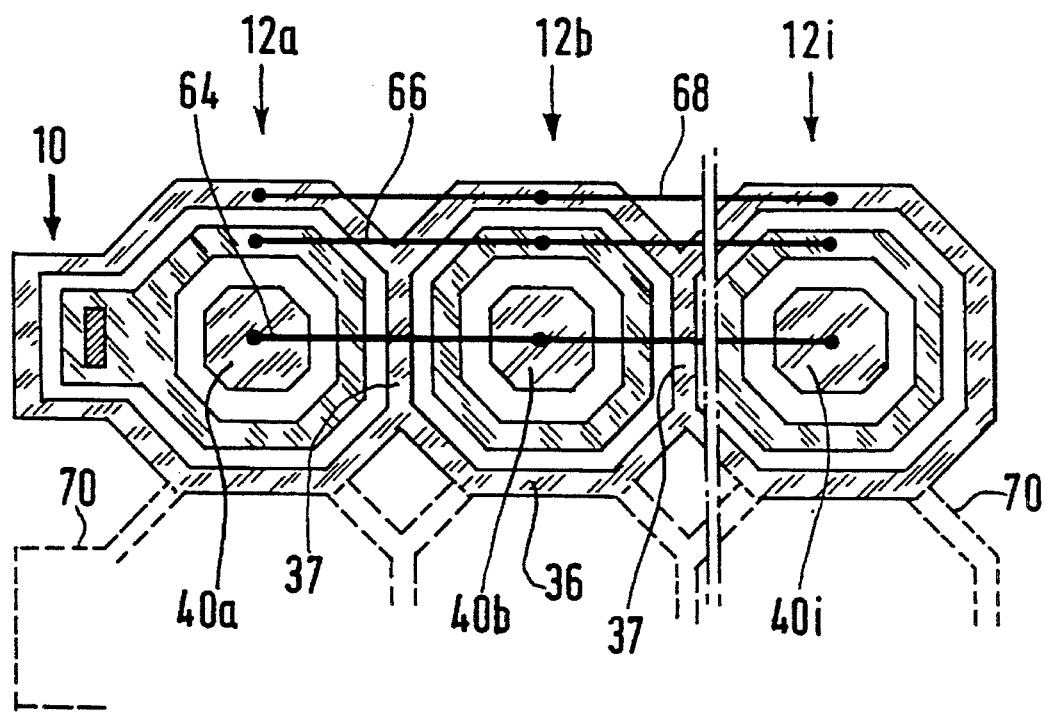

FIG. 1 is a circuit diagram of the combination of a bipolar transistor and a junction field effect transistor representing the prior-art device as well as the device according to the invention, FIG. 2 is a cross-sectional, partly perspective view of a first example of the device according to the invention, FIG. 3 is a partial cross-section taken on the line III—III of the device shown in FIG. 2, FIG. 4 is a partial diagrammatic cross-section of a particular device according to the invention in which field electrodes are used, FIG. 5 is a diagrammatic plan view of a device according to a second embodiment of the invention, and FIG. 6 is a diagrammatic plan view of a third embodiment of the device according to the invention.

The circuit diagram of FIG. 1 shows the combination of a bipolar NPN transistor 10 and a junction field effect transistor 12 of the N-channel type. The collector of the bipolar transistor 10 is connected to the source S of the field effect transistor 12, and the base of the bipolar transistor 10 is connected to one of the gates G1 of the field effect transistor 12. Another gate G2 of the field effect transistor is formed by the semiconductor substrate from which the device is constructed. The connection between the base of the bipolar transistor 10 and the gate G1 of the field effect transistor 12 forms a control terminal 14 for the device, which terminal receives an input voltage Vi. The main current path is formed by the emitter/collector circuit of the transistor 10 in series with the source/drain circuit of the transistor 12. A terminal 16 connected to the emitter of transistor 10 forms one of the end contacts of the main current circuit of the device, while the other end terminal 18 is connected to the drain D of the field effect transistor 12, to which terminal a voltage Vd is applied.

Such an arrangement is known in particular from U.S. Pat. No. 4,835,596, and is capable of receiving a high positive voltage Vd, while the field effect transistor 12 interposes an important drain/source voltage when this transistor 12 is controlled into a channel pinch-off state:, whereby the emitter/collector voltage of the bipolar transistor 10 remains below the breakdown voltage of this transistor. Obviously, it is necessary to observe the realization conditions of this device so that it functions satisfactorily when the gate G1 of the transistor 12 is connected to the base of the bipolar transistor 10.

These conditions are such that the field effect transistor 12, of the so-called depletion type, has a threshold voltage whose absolute value is lower than the breakdown voltage $BV_{CEO}$ of the bipolar transistor 10. These conditions are known to those skilled in the art and can be derived from experimental data.

FIG. 2 shows in a highly diagrammatic cross-section a first embodiment of the device according to the invention. According to this Figure, a thin N-type weakly doped epitaxial layer 20 rests on a P-type substrate 22 which is also weakly doped, the assembly of the device being surrounded by an insulating region 24 made from, for example, thick oxide. A bipolar transistor 10 is realized by means of an $N^+$-type emitter zone 26 accommodated in a base zone 28 of the $P^+$-type less strongly doped than the former zone and having a lateral extension 30 which forms one of the gates of a field effect transistor 12. A collector zone of the transistor 10 is formed by a portion 32 of the epitaxial layer 20 and by a buried layer region 34 which is heavily $N^+$-type doped and which extends below the emitter zone 26. The device also comprises a peripheral $N^+$-type, region 36, which is heavily doped and surrounds the bipolar transistor 10 provided with its lateral extension 30 of the base zone on three sides, one of these sides being not visible in the Figure.

According to the invention, the lateral extension 30 of the base zone comprises an opening 38 in which a drain region 40 for the field effect transistor 12 is situated, which drain region is of the heavily doped $N^+$-type and is surrounded on all sides by said lateral extension 30, and separated therefrom by a given lateral distance which is substantially constant. The buried layer region 34 is of elongate shape and extends longitudinally to beyond the base zone 28 and its lateral extension 30 so as to be covered by the heavily doped peripheral region 36. This latter region thus forms together with the buried layer region 34 the source of the field effect transistor 12.

The terminals to the three electrodes of the device as well as the voltages applied to these terminals have been indicated very diagrammatically with the same reference symbols as in FIG. 1.

The fact that the drain zone 40 of the field effect transistor 12 is entirely surrounded by the lateral extension 30 of the base zone which acts as the gate of this transistor leads to a very favourable device for increasing the admissible voltage Vd-Vi, i.e. the reverse voltage between the drain region 40 and the lateral extension 30 forming a gate for this transistor. In fact, by applying a high positive voltage Vd, a depletion zone develops on the one hand in the substrate 22 and on the other hand in a portion of the epitaxial layer 20 situated below the drain region 40 and extending laterally towards the lateral extension 30 forming the gate of the transistor 12. Compared with the prior-art device in which the drain region surrounds the gate of the field effect transistor, and in which an angular contour of the gate creates zones where the electric field is stronger, the angular contour of the drain, zone 40 in the device according to the invention, by contrast, does not produce such increases of the electric field. This is because the depletion zone of the epitaxial layer 20 develops starting from the opening 38 which has a concave contour in the direction of the drain region 40.

According to a preferred embodiment of the invention shown in FIG. 2, the lateral extension 30 of the base zone is bounded by an adjacent region 42 of the same conductivity type but more weakly doped than the lateral extension 30, along the edge of the opening 38 in which the drain region 40 is situated. The electric field developed with a strong biasing of the drain region 40 is thus reduced and the breakdown voltage of the drain/gate junction is accordingly increased.

FIG. 3 shows a partial cross-section of the device of FIG. 2 taken on the line III—III. It is clearly visible in this Figure that the heavily doped buried layer region 34 extends longitudinally to beyond the base zone 28 with its lateral extension 30 so as to be covered by the heavily doped peripheral region 36 which forms together with the buried layer region 34 the source of the field effect transistor.

FIG. 4 is a partial cross-section on an enlarged scale of a region surrounded by a broken line referenced IV in FIG. 2. In FIG. 4, the dimensions, especially those in the thickness direction, have been exaggerated for greater clarity. This Figure shows the end of the lateral extension 30 of the base zone provided with a more weakly doped adjacent region 42 which faces the drain region 40a, 40b of the field effect transistor. As is shown in the Figure, according to a practical embodiment, the drain region is here formed by a heavily doped, comparatively deep part 40a diffusion which corresponds to that used for realizing the peripheral region 36, and an even more heavily doped but thinner region 40b whose diffusion corresponds to that used for realizing the emitter 26 of the bipolar transistor. This particular circumstance is not essential and the drain zone might equally well be realizing in one operation without a substantial difference in the result. The separation distance w between on the one hand the end of the lateral extension of the base zone, including the more weakly doped adjacent region 42, and on the other hand the drain region 40a was called hereinbefore the lateral distance between these two regions.

FIG. 4 shows an example of an embodiment of the invention using field electrodes. A first insulating layer 44 covers the surface of the semiconductor body which comprises the device. A first field electrode 46 formed by a conductive layer made of metal or of a doped polycrystalline semiconductor material is in contact with the lateral extension 30 through a first opening 48 provided in the first insulating layer 44. This first field electrode extends on the first insulating layer above the adjacent more weakly doped region 42 in the direction of the drain region 40a over a distance which is smaller than half the lateral distance w.

A first part 50a of a second field electrode 50 of the same kind of material as the first field electrode 46 is in contact with the drain region 40b through a second opening 52 in the first insulating layer 44. This first part 50a extends laterally over the first insulating layer 44 in the direction of the first field electrode 46 and over a distance which is smaller than half the lateral distance w. These two electrodes have ends which face one another, and are separated by a distance v which is preferably situated approximately centrally at half the lateral distance w.

The assembly is then covered with a second insulating layer 54 which carries a second part 50b of the second field electrode. This second part 50b is in contact with the first part 50a through an opening 56 in the second insulating layer 54. It extends laterally on the second insulating layer 54 in the direction of the first field electrode 46 and preferably up to perpendicularly above the latter.

The first field electrode 46 and the first part 50a of the second field electrode have the object of distributing the electric field at the surface of the device when the voltage Vd applied to the drain is high. An optimum distribution of this electric field is realized when the half-voltage equipotential of the drain voltage Vi is situated approximately at the center of the lateral distance w. In practice, the contact layer with the field effect transistor drain is of necessity provided, at least in one direction, so as to extend fully over the lateral distance w. As a result, this contact layer induces a disturbance in the distribution of this electric field through its field effect, which is unfavourable. Therefore, an equivalent situation is created in all directions, as is shown in FIG. 4, i.e. the second part 50b of the second field electrode extends at least up to perpendicularly above the first field electrode 46 so that the same electric field conditions are realised along the entire circumference of the drain region 40 of the field effect transistor. It is easily understood that the most advantageous distribution of the electric field at the surface of the device in the region of annular shape corresponding to the lateral distance w is realized when the second insulating layer 54 is the thickest layer. With a second insulating layer 54 made from silicon oxide with a thickness of approximately 600 nm, an increase of the breakdown voltage of the order of 5 V is obtained compared with a device which is not provided with field electrodes as described above.

Example of a practical embodiment

A series of devices according to the invention is made under the following conditions: substrate 22 of P-type silicon with a doping concentration of between 1 and $2 \times 10^{15}$ at/cm$^3$, N-type epitaxial layer 20 of 1.2 µm thickness doped with a concentration of $1 \times 10^{16}$ at/cm$^3$, specific sheet resistance of the lateral extension 30 of the base zone=500 Ω/□, specific sheet resistance of the region 42 adjacent to the lateral extension=6000 Ω/□, lateral distance w=6 µm.

The product of the thickness of the epitaxial layer and its doping concentration is equal to $1.2 \times 10^{12}$ At/cm$^2$, which indicates that this epitaxial layer is capable of being depleted of charge carriers at a voltage Vd-Vi which is lower than the breakdown voltage between drain and gate, of the field effect transistor. A nearly optimum distribution of the electric field between the gate and the drain of the field effect transistor is thus realised.

The devices manufactured under these conditions showed a breakdown voltage of 55 V on average when provided with field electrodes as described above, against 50 V for the same devices but without field electrodes. By comparison, devices with the known construction of U.S. Pat. No. 4,835,596 showed a breakdown voltage of approximately 30 V only, all other physical conditions being the same. The advantage obtained through the invention is therefore very valuable.

FIG. 5 shows a plan view of another embodiment of a device which is particularly advantageous when the device is to provide a relatively high output current. According to this embodiment, the bipolar transistor has its emitter realized in the form of a central strip 26 below which the heavily doped buried layer region 34 is situated, shown in broken lines in the Figure. This buried layer region 34 has an elongate shape and extends longitudinally up to the heavily doped peripheral region 36 which now surrounds the device completely. The lateral extension 30 of the base zone extends on either side of the emitter region 26 and has two openings 38a and 38b for two drain regions 60a and 60b of the field effect transistor. The latter is thus formed in two parts which are substantially symmetrical relative to the longitudinal axis of the buried layer region 34. Two openings 62a, 62b for contact with the base of the bipolar transistor and with the gate of the field effect transistor are also shown in FIG. 5.

FIG. 6 illustrates yet another embodiment of a device according to the invention which is particularly recommended when a high output current is sought.

According to this embodiment, the field effect transistor has the shape of a plurality of cells 12a, 12b, ... 12i which are laterally aligned relative to the bipolar transistor 10. The heavily doped peripheral region 36 of one cell 12b has a part 37 in common with the peripheral region of the cell 12a which is adjacent thereto.

The drain regions 40a, 40b, ... 40i are electrically interconnected by a metallization strip which is insulated from the reminder of the device by an insulating layer outside the contact with the drain regions. Such a connection is symbolically indicated by a line 64. Similarly, the base of the transistor 10, its lateral extension into the cell 12a, and the gate regions of the cells 12b, ... 12i are electrically connected to one another, as is indicated by the line 66.

The peripheral region 36 which forms the source of the field effect transistor may also be provided with a metallization strip, symbolized by a line 68 in the Figure, so as to reduce the resistance of this source electrode.

The suitability of this device for supplying a high current may yet be increased through the association of several transistors in parallel in the manner indicated by the portion 70 drawn in broken lines. Finely, according to a modification which is not shown, the plurality of cells of the field effect transistor could also extend on either side of the bipolar transistor 10 instead of extending on one side only, as is shown in FIG. 6.

Obviously, modifications of the described embodiments may be made by those skilled in the art without departing from the scope of the invention as claimed hereinafter.

I claim:

1. An integrated device formed by the combination of a bipolar transistor (10) and a junction field effect transistor (12), comprising:

a heavily doped emitter zone (26) of a first conductivity type;

a base zone (28) which is less heavily doped than the emitter zone, which is of a second conductivity type opposed to the first type, in which the emitter zone (26) is included, and which comprises a lateral extension (30) forming a gate for the field effect transistor;

a collector zone formed by a portion (32) of a weakly doped epitaxial layer (20) of the first conductivity type on a weakly doped substrate (22) of the second conductivity type, and by a heavily doped buried layer region (34) of the first conductivity type extending below the emitter zone (26); which device in addition comprises a heavily doped peripheral region (36) of the first conductivity type which surrounds the base zone (28) and its lateral extension (30) at least partly and at a selected distance;

characterized in that the lateral extension (30) of the base zone comprises an opening (38) in which a drain region (40) of the first conductivity type for the field effect transistor is situated, said drain region being heavily doped, completely surrounded by said lateral extension (30) and separated therefrom by a given lateral distance (w), and in that the buried layer region (34), which is of an elongate shape, extends in a longitudinal direction to beyond the base zone and its lateral extension so as to be covered by said peripheral region (36), said peripheral region forming together with the buried layer region (34) the source of the field effect transistor (12).

2. A device as claimed in claim 1, characterized in that the lateral extension (30) of the base zone is bounded by an adjacent more weakly doped region (42) of the same conductivity type along the edge of the opening (38) comprising the drain region (40).

3. A device as claimed in claim 2, characterized in that the thickness of the epitaxial layer (20) and the doping concentration of this layer are chosen such that said epitaxial layer, in a region adjoining said adjacent more weakly doped region (42), is completely depleted of charge carriers at a given voltage applied to the junction formed between the drain region (40) and the gate (30) of the field effect transistor (12), which given voltage is lower than the breakdown voltage of said junction.

4. A device as claimed in claim 2, characterized in that it comprises in that order on the surface of the device:

a first insulating layer (44), a first field electrode (46) formed by a conductive layer in contact with the lateral extension (30) of the base zone through a first opening (48) in the first insulating layer (44) and extending on the first insulating layer over said adjacent more weakly doped region (42), in the direction of the drain region (40) over a distance smaller than half the said lateral distance (w);

a first part (50a) of a second field electrode, conductive and in contact with the drain region (40) through a second opening (52) in the first insulating layer (44), and extending in lateral direction on the first insulating layer in the direction of the first field electrode (46) over a distance smaller than half the said lateral distance (w), a second insulating layer (54); and a second part (50b) of the second field electrode, conductive with and in contact with the first part (50a) of this same electrode through an opening (56) in the second insulating layer, and extending laterally on the second insulating layer in the direction of the first field electrode (46) at least about up to this first field electrode.

5. A device as claimed in claim 1, characterized in that the field effect transistor (12) is formed by two parts arranged symmetrically relative to a longitudinal axis of the buried layer region (34), of which parts homologous regions (60a, 60b) are electrically connected in parallel, and in that the peripheral region (36) completely surrounds the base zone and its lateral extension (30).

6. A device as claimed in claim 1, characterized in that the field effect transistor is formed by a plurality of cells (12a, 12b ... 12i) laterally aligned relative to the bipolar transistor (10), the peripheral region (36) of one cell (12b) having a part (37) in common with that of the cell (12a) adjacent thereto, while homologous regions of the cells are interconnected with one another.

* * * * *